US011506772B2

(12) United States Patent
Osawa

(10) Patent No.: US 11,506,772 B2
(45) Date of Patent: Nov. 22, 2022

(54) ULTRASONIC DEVICE AND ULTRASONIC MEASURING APPARATUS

(71) Applicant: Seiko Epson Corporation, Tokyo (JP)

(72) Inventor: Eiji Osawa, Chino (JP)

(73) Assignee: SEIKO EPSON CORPORATION ( * ) Notice: Subject to any disclaimer, the term of this patent is extended or adjusted under 35 U.S.C. 154(b) by 336 days.

(21) Appl. No.: 16/170,587

(22) Filed: Oct. 25, 2018

(65) Prior Publication Data
US 2019/0129019 A1 May 2, 2019

(30) Foreign Application Priority Data

Oct. 26, 2017 (JP) .............................. JP2017-207578

(51) Int. Cl.
G01S 7/521 (2006.01)
H01L 41/113 (2006.01)
B06B 1/06 (2006.01)

(52) U.S. Cl.
CPC ............ G01S 7/521 (2013.01); B06B 1/0622 (2013.01); H01L 41/1132 (2013.01)

(58) Field of Classification Search
CPC .... G01S 7/521; B06B 1/0622; H01L 41/1132
See application file for complete search history.

(56) References Cited

U.S. PATENT DOCUMENTS

| 2002/0105250 A1 | 8/2002 | Klee et al. |
| 2003/0141783 A1 | 7/2003 | Klee et al. |
| 2009/0219345 A1 * | 9/2009 | Yazaki ................. B41J 2/14233 347/68 |
| 2010/0202253 A1 | 8/2010 | Nakamura |
| 2010/0302323 A1 * | 12/2010 | Yagi ..................... B41J 2/14233 347/70 |
| 2015/0027228 A1 * | 1/2015 | Endo .................... G01N 29/343 73/641 |
| 2015/0273526 A1 * | 10/2015 | Tsuruno ............... A61B 8/4488 600/443 |

(Continued)

FOREIGN PATENT DOCUMENTS

| CN | 104236379 A * 12/2014 |
| JP | 58-106774 U 7/1983 |

(Continued)

Primary Examiner — Isam A Alsomiri
Assistant Examiner — Abdallah Abulaban
(74) Attorney, Agent, or Firm — Harness, Dickey & Pierce, P.L.C.

(57) ABSTRACT

An ultrasonic device includes: a substrate provided with a first opening and a second opening; a support film that is provided on the substrate and blocks the first opening and the second opening; a transmitting piezoelectric film that is provided at a position of the support film which overlaps the first opening when viewed in a thickness direction of the substrate, and that is interposed between a pair of electrodes in the thickness direction of the substrate; and a receiving piezoelectric film that is provided at a position of the support film which overlaps the second opening when viewed in the thickness direction of the substrate, and that is interposed between a pair of electrodes in the thickness direction of the substrate. In the thickness direction of the substrate, a thickness dimension of the transmitting piezoelectric film is larger than a thickness dimension of the receiving piezoelectric film.

4 Claims, 10 Drawing Sheets

(56) References Cited

U.S. PATENT DOCUMENTS

| | | | |
|---|---|---|---|
| 2015/0364670 A1* | 12/2015 | Ohta | H01L 41/1873 |
| | | | 310/360 |
| 2016/0089111 A1 | 3/2016 | Yamada et al. | |
| 2016/0120513 A1* | 5/2016 | Aragaki | G01S 15/8963 |
| | | | 600/443 |
| 2019/0029643 A1 | 1/2019 | Yamada et al. | |

FOREIGN PATENT DOCUMENTS

| | | |
|---|---|---|
| JP | 2002-271897 A | 9/2002 |
| JP | 2011-056103 A | 3/2011 |
| JP | 5434109 B2 | 3/2014 |
| JP | 2015-195351 A | 11/2015 |
| JP | 2016-002352 A | 1/2016 |
| JP | 2016-072862 A | 5/2016 |
| JP | 2017-085426 A | 5/2017 |
| KR | 2013-0115656 A | 10/2013 |

* cited by examiner

ULTRASONIC DEVICE AND ULTRASONIC MEASURING APPARATUS

BACKGROUND

1. Technical Field

The present invention relates to an ultrasonic device, an ultrasonic measuring apparatus, and the like.

2. Related Art

In the related art, an ultrasonic transducer using a so-called a bulk-type piezoelectric body has been known as an ultrasonic transducer that performs a transmitting process and a receiving process of an ultrasonic wave, the ultrasonic transducer including a piezoelectric body interposed between a pair of electrodes, transmitting the ultrasonic wave by applying a voltage between the electrodes and causing the piezoelectric body to vibrate, and receiving the ultrasonic wave by detecting an output voltage from the piezoelectric body to which the ultrasonic wave is input.

However, the bulk-type piezoelectric body needs to have a large thickness dimension, and thus it is difficult to achieve a thin or compact piezoelectric body.

In this respect, there has been known an ultrasonic transducer using a thin piezoelectric film, the ultrasonic transducer being configured to include a vibration film provided to cover an opening of a support body provided with the opening and the piezoelectric film interposed between a pair of electrodes (for example, see JP-A-2002-271897).

The ultrasonic transducer causes the vibration film to vibrate by applying the voltage between the electrodes so as to transmit the ultrasonic wave and detects reception of the ultrasonic wave in response to an output voltage from the piezoelectric film due to the vibration of the vibration film. In the ultrasonic transducer that causes the vibration film to vibrate by such a thin piezoelectric body, it is possible to significantly reduce a thickness dimension thereof in an ultrasonic-wave transmitting/receiving direction, compared to the bulk-type ultrasonic transducer, and thus it is possible to obtain a thin or compact ultrasonic measuring apparatus.

Incidentally, the thin-film type ultrasonic transducer transmits the ultrasonic wave due to the vibration of the vibration film and, then, detects reception of the ultrasonic wave from a strain of the piezoelectric film due to the vibration film that is caused to vibrate in response to a reflected ultrasonic wave. In this case, when the ultrasonic wave is transmitted, the vibration film is significantly displaced, and thereby an ultrasonic wave having a high output is output. When the ultrasonic wave is received, vibration is highly sensitively detected such that the reception of the ultrasonic wave needs to be detected even in a case of small vibration of the vibration film. Hence, in order to achieve characteristics depending on respective functions, it is necessary to configure an ultrasonic transducer for transmission and an ultrasonic transducer for receiving. Hence, when the ultrasonic transducer disclosed in JP-A-2002-271897 is an ultrasonic transducer for both of transmission and reception or an ultrasonic transducer having the same configuration for transmission and for reception is used, a problem arises in that transmission and reception efficiency of the ultrasonic wave is reduced.

SUMMARY

An advantage of some aspects of the invention is to provide an ultrasonic device having high transmission and reception efficiency of an ultrasonic wave and an ultrasonic measuring apparatus.

An ultrasonic device according to an application example of the invention includes: a substrate provided with a first opening and a second opening; a support film that is provided on the substrate and blocks the first opening and the second opening; a transmitting piezoelectric film that is provided at a position of the support film which overlaps the first opening when viewed in a thickness direction of the substrate, and that is interposed between a pair of electrodes in the thickness direction of the substrate; and a receiving piezoelectric film that is provided at a position of the support film which overlaps the second opening when viewed in the thickness direction of the substrate, and that is interposed between a pair of electrodes in the thickness direction of the substrate. In the thickness direction of the substrate, a thickness dimension of the transmitting piezoelectric film is larger than a thickness dimension of the receiving piezoelectric film.

In the application example, in the ultrasonic device, a transmitting ultrasonic transducer (transmission transducer) is configured to include the support film that blocks the first opening, the transmitting piezoelectric film, and the pair of electrodes with the transmitting piezoelectric film interposed therebetween. In addition, in the ultrasonic device, a receiving ultrasonic transducer (reception transducer) is configured to include the support film that blocks the second opening, the receiving piezoelectric film, and the pair of electrodes with the receiving piezoelectric film interposed therebetween. The transmitting piezoelectric film constituting the transmission transducer is formed to have a larger thickness dimension than the thickness dimension of the receiving piezoelectric film constituting the reception transducer.

In such a configuration, since the transmission transducer and the reception transducer are provided as separate transducers, it is possible to have characteristics suitable for transmitting the ultrasonic wave in the transmission transducer and to have characteristics suitable for receiving the ultrasonic wave in the reception transducer. Accordingly, it is possible to more improve transmission and reception efficiency of the ultrasonic wave, compared to a case where the transmission and reception of the ultrasonic wave are performed in one ultrasonic transducer. In other words, it is possible to transmit an ultrasonic wave having a high acoustic pressure in the transmission of the ultrasonic wave, and it is possible to receive the ultrasonic wave with high accuracy and high reception efficiency in the reception of the ultrasonic wave.

Incidentally, in the transmission transducer, the ultrasonic wave that is output to a predetermined applied electric field is increased in acoustic pressure that is output as the transmitting piezoelectric film is increased in the thickness dimension. In other words, in the transmission transducer, it is preferable to increase the thickness dimension of the transmitting piezoelectric film in order to improve the transmission efficiency of the ultrasonic wave.

On the other hand, in the reception transducer, the smaller the thickness dimension of the receiving piezoelectric film, the larger the displacement amount of the receiving piezoelectric film with respect to a predetermined acoustic pressure from a sound source, and thus a signal value that is output from the receiving piezoelectric film increases. In other words, in the reception transducer, it is preferable to decrease the thickness dimension of the receiving piezoelectric film in order to improve the reception efficiency of the ultrasonic wave.

In the application example, the transmitting piezoelectric film is configured to have a larger thickness dimension than the thickness dimension of the receiving piezoelectric film. In other words, compared to a case where the transmission and the reception of the ultrasonic wave is performed by one ultrasonic transducer, a case where the transmission transducer and the reception transducer are each configured to use the piezoelectric film having the same thickness dimension, or the like, it is possible for the transmission transducer to have higher transmission efficiency of the ultrasonic wave, it is possible for the reception transducer to have higher reception efficiency of the ultrasonic wave, and thus the transmission and reception efficiency improves in the ultrasonic device.

In the ultrasonic device according to the application example, it is preferable that, when an area of an overlap between the transmitting piezoelectric film and the pair of electrodes with the transmitting piezoelectric film interposed therebetween is set as a first area, and an area of an overlap between the receiving piezoelectric film and the pair of electrodes with the receiving piezoelectric film interposed therebetween is set as a second area, when viewed in the thickness direction of the substrate, the second area is smaller than the first area.

A receiving signal, which is output from the reception transducer when the ultrasonic wave is received, is a potential difference between the pair of electrodes with the receiving piezoelectric film interposed therebetween, which occurs when the receiving piezoelectric film is deformed. The potential difference is inversely proportional to the capacitance between the electrodes. Thus, the smaller the capacitance, the larger the potential difference. In addition, the capacitance between the electrodes is proportional to an electrode area. Thus, the smaller the electrode area, the smaller the capacitance.

In the application example with this configuration, in plan view when viewed in the thickness direction of the substrate, the second area (electrode area) of the overlap between the receiving piezoelectric film and the pair of electrodes is smaller than the first area (electrode area) of the overlap between the transmitting piezoelectric film and the pair of electrodes. Therefore, since the capacitance between the electrodes decreases in the reception transducer, a voltage of the receiving signal, which is obtained when the ultrasonic wave is received, increases, and thus the reception efficiency further improves in the reception transducer.

It is preferable that the ultrasonic device according to the application example further includes a plurality of reception transducers, each of which is configured to include the receiving piezoelectric film and the pair of electrodes with the receiving piezoelectric film interposed therebetween, and the plurality of reception transducers are connected in series.

In the application example with this configuration, the plurality of reception transducers are connected in series.

When the plurality of reception transducers are connected in series, receiving signals received by the reception transducers are added and output, and thereby it is possible to increase the voltage of the receiving signal. In other words, since one reception element group is formed by the plurality of reception transducers connected in series, and apparent capacitance in the reception element group decreases in association with the number of reception transducers which are connected in series, it is possible to increase the voltage of the receiving signal.

An ultrasonic measuring apparatus according to an application example of the invention includes: the ultrasonic device described above; and a controller that controls the ultrasonic device.

In the application example, as described above, it is possible to improve the transmission and reception efficiency in the ultrasonic device. Hence, the controller controls the ultrasonic device. In this manner, it is possible to execute transmitting and receiving processes of the ultrasonic wave with high transmission and reception efficiency, and it is possible to execute the ultrasonic measurement with high accuracy based on such a result therefrom.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Hereinafter, an ultrasonic device according to an embodiment of the invention will be described with reference to the drawings.

Figure 1:
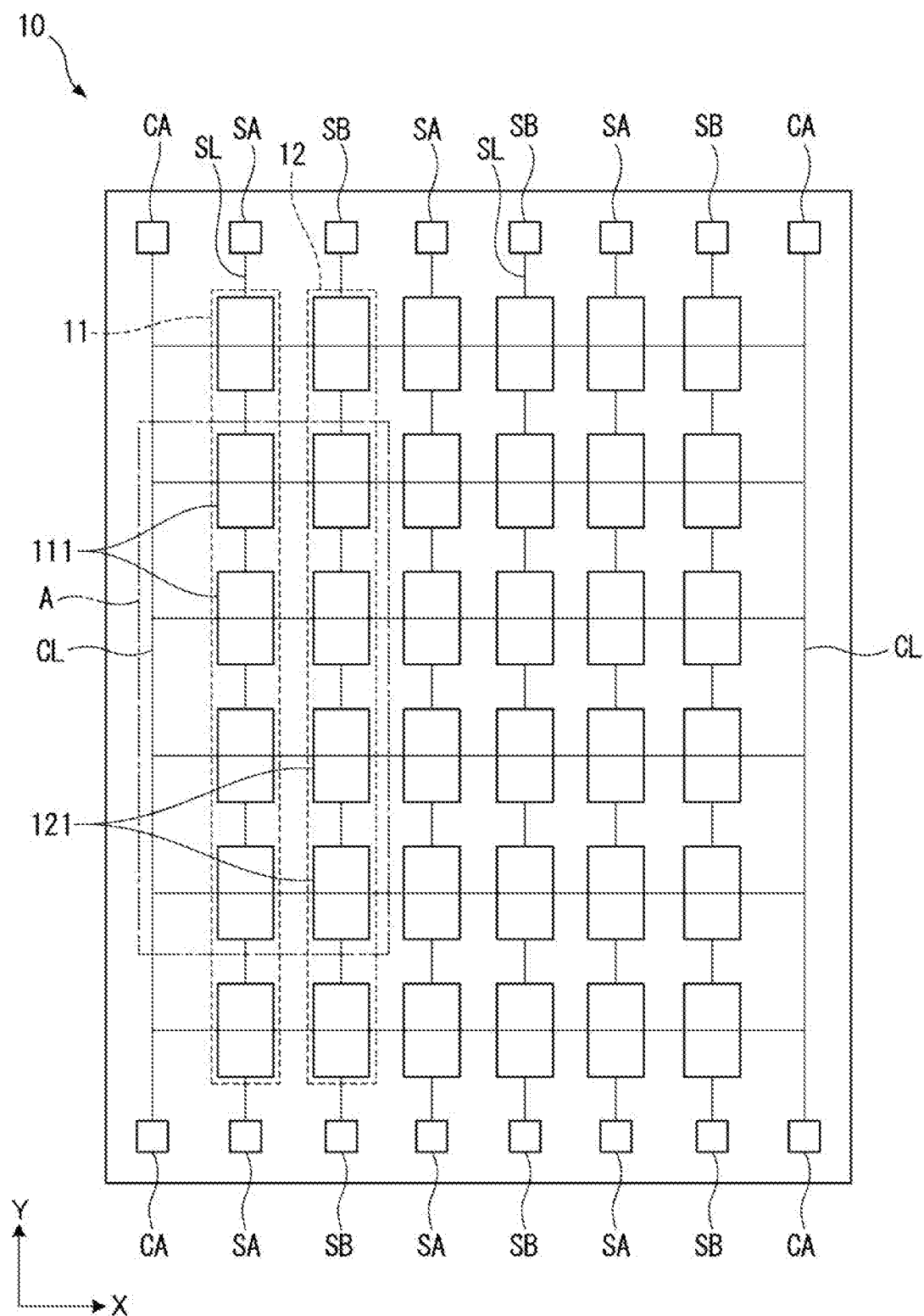
FIG. 1 is a view illustrating a schematic configuration of an ultrasonic device according to a first embodiment of the invention.

FIG. 1 is a view illustrating a schematic configuration of an ultrasonic device 10. In FIG. 1, for convenience of the description, the number of ultrasonic transducers (transmission transducers 111 and reception transducers 121) is illustrated to be reduced; however, more ultrasonic transducers are actually arranged in a Y direction and an X direction.

Here, in the following description, a thickness direction of the ultrasonic device 10 is set as a Z direction, and two axial directions orthogonal to the Z direction is set as an X axis and a Y axis.

As illustrated in FIG. 1, the ultrasonic device 10 is formed to have a rectangular plate shape with the Z direction as its thickness direction, for example, and is configured to include an ultrasonic transmitter 11, an ultrasonic receiver 12, a signal electrode wire SL, a common electrode wire CL, a first signal terminal SA, a second signal terminal SB, and a common terminal CA in an XY plane. The ultrasonic device 10 transmits the ultrasonic wave to a medium such as the air by the ultrasonic transmitter 11 and receives the ultrasonic wave propagated into the air and input by the ultrasonic receiver 12.

The ultrasonic transmitter 11 has a plurality of ultrasonic transducers for transmission (hereinafter, abbreviated to the transmission transducers 111), and the plurality of transmission transducers 111 are configured to be disposed in the Y direction.

In addition, the ultrasonic receiver 12 has a plurality of ultrasonic transducers for reception (hereinafter, abbreviated to the reception transducers 121), and the plurality of reception transducers 121 are configured to be disposed in the Y direction.

In the ultrasonic device 10 of the embodiment, the plurality of ultrasonic transmitters 11 and ultrasonic receivers 12 are disposed alternately in the X direction, one transmission channel is configured of one ultrasonic transmitter 11, and one reception channel is configured of one ultrasonic receiver 12. The transmission channel may be configured of the plurality of ultrasonic transmitters 11. Similarly, one reception channel may be configured of the plurality of ultrasonic receivers 12.

In addition, disposition of the ultrasonic transmitters 11 and the ultrasonic receivers 12 is not limited to a configuration in which the ultrasonic transmitters and the ultrasonic receivers are alternately disposed in the X direction as described above, and a configuration in which the plurality of ultrasonic transmitters 11 are disposed on a −X side and the plurality of ultrasonic receivers 12 are disposed on a +X side with the center portion of the ultrasonic device 10 in the X direction as a boundary may be employed.

Figure 2:
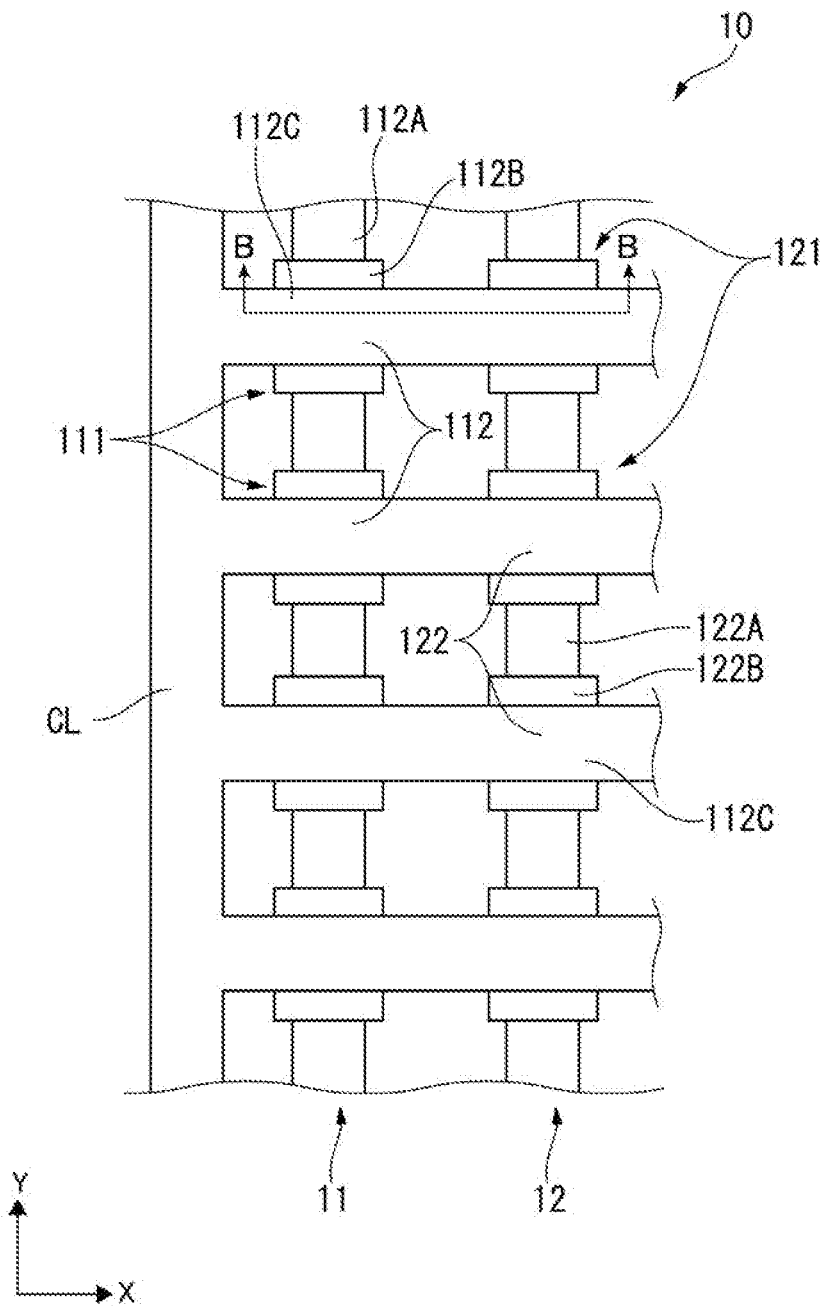
FIG. 2 is an enlarged plan view illustrating an enlarged part of the ultrasonic device of the first embodiment.
Figure 3:
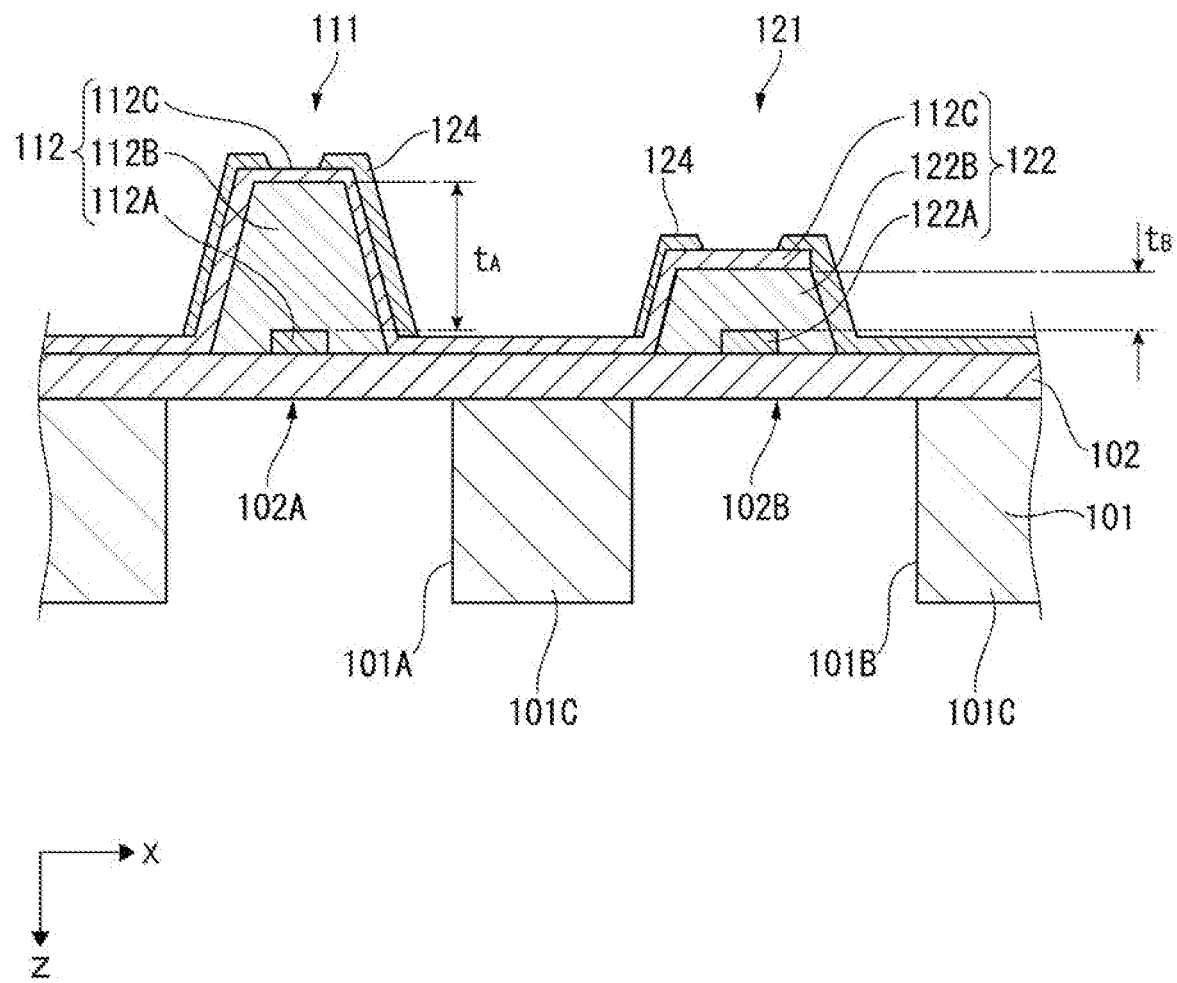
FIG. 3 is a sectional view of the ultrasonic device taken along line B-B in FIG. 2.

FIG. 2 is an enlarged plan view illustrating the transmission transducers 111 and the reception transducers 121 by enlarging a part (region A illustrated in FIG. 1) of the ultrasonic device 10 of the embodiment. FIG. 3 is a sectional view of the ultrasonic device 10 taken along line B-B in FIG. 2.

As illustrated in FIG. 3, the ultrasonic device 10 includes an element substrate 101, a support film 102 laminated on the element substrate 101, a transmission piezoelectric element 112 provided on the support film 102, and a reception piezoelectric element 122 provided on the support film 102.

For example, the element substrate 101 is a semiconductor substrate made of Si or the like. The element substrate 101 is provided with a first opening 101A provided at a position overlapping a disposed position of each transmission transducer 111 and a second opening 101B provided at a position overlapping a disposed position of each reception transducer 121. The first opening 101A and the second opening 101B are blocked by the support film 102 provided on a side of one surface (a −Z side in FIG. 3) of the element substrate 101. An opening width (opening area) of the first opening 101A and the second opening 101B is set, based on a frequency of the ultrasonic wave to be transmitted and received.

For example, the support film 102 is configured of a single layer of $SiO_2$, a laminate of $SiO_2$, $ZrO_2$, and yttrium-stabilized zirconium (YSZ), or the like and is provided to cover the entire surface of the element substrate 101 on the −Z side. A thickness dimension of the support film 102 is sufficiently smaller than a thickness dimension of the element substrate 101. Young's modulus of $SiO_2$ is about 75 GPa. In addition, Young's modulus of $ZrO_2$ is about 200 GPa.

Here, a region of the support film 102 which overlaps the first opening 101A constitutes a first vibration portion 102A, and a region of the support film which overlaps the second opening 101B constitutes a second vibration portion 102B in plan view when viewed in the thickness direction (Z direction) of the element substrate 101 and the support film 102. In other words, the first vibration portion 102A is supported by a partition portion 101C that surrounds the first opening 101A, and the second vibration portion 102B is supported by the partition portion 101C that surrounds the second opening 101B.

The transmission piezoelectric element 112 and the first vibration portion 102A that blocks the first opening 101A constitute the transmission transducer 111.

As illustrated in FIGS. 2 and 3, the transmission piezoelectric element 112 is configured of a laminate of a lower transmission electrode 112A, a transmitting piezoelectric film 112B, and an upper electrode 112C and is provided on the first vibration portion 102A. The lower transmission electrode 112A and the upper electrode 112C constitute a pair of electrodes according to the invention, in which the transmitting piezoelectric film 112B is interposed between the electrodes in the thickness direction of the substrate.

The lower transmission electrode 112A is formed to have a linear shape in the Y direction and is provided over the plurality of transmission transducers 111. Hence, the lower transmission electrode 112A have the same potential in the transmission transducers 111 aligned in the Y direction. As illustrated in FIG. 1, the lower transmission electrode 112A is connected to the corresponding first signal terminals SA disposed on the outer periphery of the support film 102 on the ±Y sides, via the signal electrode wire SL.

The transmitting piezoelectric film 112B is formed of a thin film of a piezoelectric body such as lead zirconate titanate (PZT) and is configured to cover the lower transmission electrode 112A on the first vibration portion 102A. The transmitting piezoelectric film 112B is formed to have a larger thickness dimension $t_A$ (dimension in the Z direction) than a thickness dimension $t_B$ of the receiving piezoelectric film 122B to be described below. As illustrated in FIG. 3, a configuration in which a protective film 124 is provided to cover side surface portions of the transmitting piezoelectric film 112B may be employed.

The upper electrode 112C is formed to have a linear shape in the X direction and is provided over the plurality of ultrasonic transducers (transmission transducers 111 and reception transducers 121) which are aligned in the X direction. In addition, the upper electrodes 112C are connected to each other via the common electrode wire CL and are connected to the common terminals CA provided on the outer periphery (for example, the ±Y sides) of the support film 102 (refer to FIG. 1). In other words, in the embodiment, the upper electrode 112C functions as a common electrode to both of the transmission piezoelectric elements 112 and the reception piezoelectric elements 122 aligned in the X direction, and the same common potential is applied to the transmission transducers 111 and the reception transducers 121.

The reception piezoelectric element 122 and the second vibration portion 102B that blocks the second opening 101B constitute the reception transducer 121.

As illustrated in FIGS. 2 and 3, the reception piezoelectric element 122 is a laminate of a lower reception electrode 122A, a receiving piezoelectric film 122B, and the upper electrode 112C and is provided on the second vibration portion 102B. In other words, the lower reception electrode 122A and the upper electrode 112C constitute a pair of electrodes, in which the receiving piezoelectric film 122B is interposed between the electrodes in the thickness direction of the substrate.

Similar to the lower transmission electrode 112A of the transmission piezoelectric element 112, the lower reception electrode 122A is formed to have a linear shape in the Y direction and is provided over the plurality of reception transducers 121. Hence, the lower reception electrode 122A have the same potential in the reception transducers 121 aligned in the Y direction. As illustrated in FIG. 1, the lower reception electrode 122A is connected to the corresponding second signal terminals SB disposed on the outer periphery of the support film 102 on the ±Y sides, via the signal electrode wire SL.

Similar to the transmitting piezoelectric film 112B, the receiving piezoelectric film 122B is formed of a thin film of a piezoelectric body such as lead zirconate titanate (PZT) and is configured to cover the lower reception electrode 122A on the second vibration portion 102B. As described above, the receiving piezoelectric film 122B has the smaller thickness dimension $t_B$ than the thickness dimension $t_A$ of the transmitting piezoelectric film 112B.

It is preferable that the PZT, of which the transmitting piezoelectric film 112B and the receiving piezoelectric film 122B are formed of, has a composition ratio of Zr and Ti of 52:48, because a high piezoelectric property is obtained. In addition, when a monoclinic crystal structure is used, it is possible to obtain a higher piezoelectric property. A material of the piezoelectric body is not limited to the PZT and may include a Pb-free material such as $BiFeMnO_3$—$BaTiO_3$ or $KNaNbO_3$. Young's modulus of PZT is about 80 GPa in a thin film.

The lower transmission electrode 112A, the lower reception electrode 122A, and the upper electrode 112C are preferably made a combination of a plurality of materials of Ti, Ir, $TiO_2$, $IrO_2$, and Pt, in terms of conductivity, stability of the materials, and thin film stress to PZT. The lower transmission electrode 112A, the lower reception electrode 122A, and the upper electrode 112C have the Young's modulus of about 200 GPa.

In the ultrasonic device 10 having such a configuration, a rectangular voltage having a predetermined frequency is applied between the lower transmission electrode 112A and the upper electrode 112C, and thereby the first vibration portion 102A vibrates such that the ultrasonic wave is transmitted from the first vibration portion 102A toward the side of the first opening 101A (a +Z side) in the transmission transducer 111.

In addition, when an ultrasonic wave (reflected wave) reflected from a target object is input to the second vibration portion 102B from the second opening 101B, the second vibration portion 102B vibrates due to the corresponding reflected wave. In this manner, an output voltage corresponding to a deformation amount (strain amount) of the receiving piezoelectric film 122B is output from the lower reception electrode 122A, and the reception of the ultrasonic wave is detected.

Thickness Dimension of Transmitting Piezoelectric Film 112B and Receiving Piezoelectric Film 122B Next, dimensions of the transmission transducer 111 and the reception transducer 121 described above will be described below.

Figure 4:
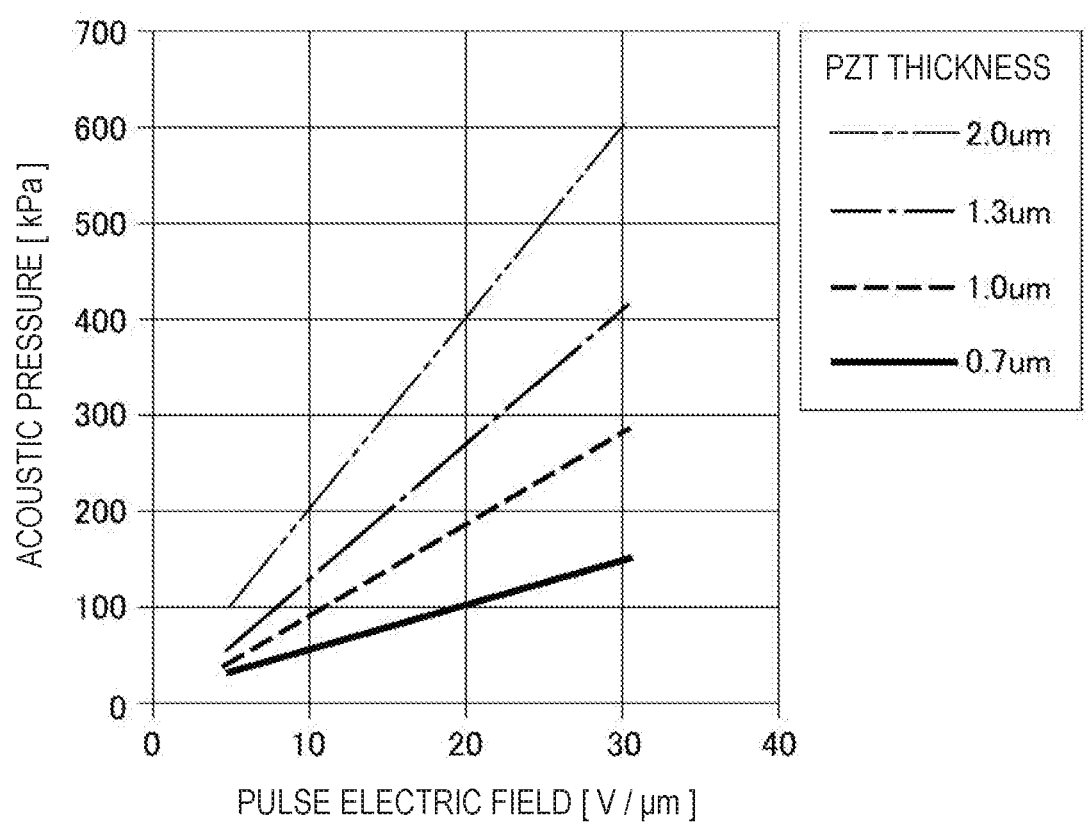
FIG. 4 is a graph illustrating a relationship between a thickness dimension of a transmitting piezoelectric film and an acoustic pressure of an ultrasonic wave that is output from a transmission transducer.

FIG. 4 is a graph illustrating a relationship between the thickness dimension $t_A$ of the transmitting piezoelectric film 112B and an acoustic pressure of the ultrasonic wave that is output into the air from the transmission transducer 111.

As illustrated in FIG. 4, in a case where the same electric field is applied to the transmission transducer 111, the larger the thickness dimension $t_A$ of the transmitting piezoelectric film 112B, the higher the acoustic pressure of the ultrasonic wave that is output from the transmission transducer 111.

Figure 5:
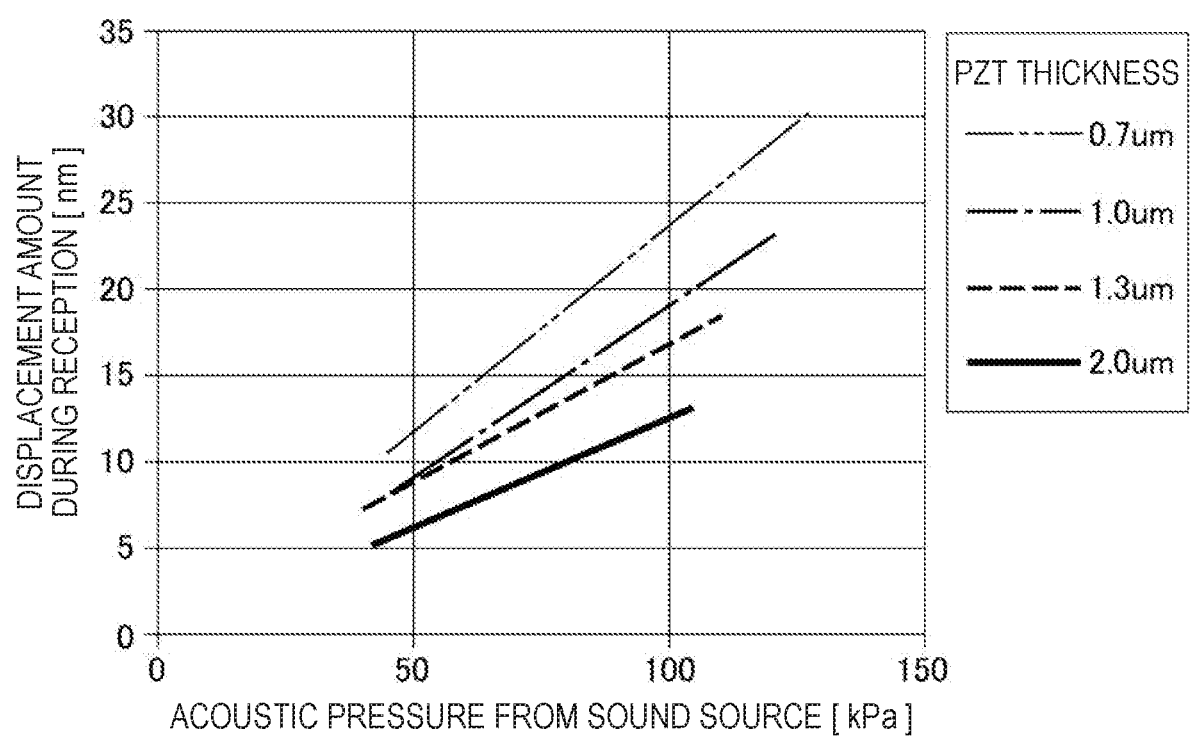
FIG. 5 is a graph illustrating a relationship between a thickness dimension of a receiving piezoelectric film and a displacement amount of a second vibration portion, which is obtained when the ultrasonic wave is received in a reception transducer.

FIG. 5 is a graph illustrating a relationship between the thickness dimension $t_B$ of the receiving piezoelectric film 122B and a displacement amount of the second vibration portion 102B, which is obtained when the ultrasonic wave is received by the reception transducer 121.

As illustrated in FIG. 5, in a case where the same acoustic pressure of the ultrasonic wave is input to the reception transducer 121, the smaller the thickness dimension $t_B$ of the receiving piezoelectric film 122B, the larger the displacement amount of the second vibration portion 102B. Hence, a voltage of the receiving signal that is output from the reception transducer 121 also increases.

In the ultrasonic device 10 of the embodiment, the transmitting piezoelectric film 112B is formed to have the thickness dimension $t_A$ larger than the thickness dimension $t_B$ of the receiving piezoelectric film 122B. Here, it is preferable that the transmitting piezoelectric film 112B is formed to have the thickness dimension $t_A$ of 1.3 μm or larger, and the receiving piezoelectric film 122B is formed to have the thickness dimension $t_B$ of 1.0 μm or smaller. By employing such a configuration, the ultrasonic wave is transmitted by using the transmission transducer 111 when the ultrasonic wave is transmitted, and the ultrasonic wave is received by using the reception transducer 121 when the ultrasonic wave is received. In this manner, it is possible to improve transmission and reception efficiency of the ultrasonic wave.

Operational Effects of Embodiment

The ultrasonic device 10 of the embodiment includes the transmission transducer 111 that transmits the ultrasonic wave and the reception transducer 121 that receives the ultrasonic wave, and the thickness dimension $t_A$ of the transmitting piezoelectric film 112B constituting the transmission transducer 111 is larger than the thickness dimension $t_B$ of the receiving piezoelectric film 122B constituting the reception transducer 121.

Therefore, the ultrasonic wave is transmitted by using the transmission transducer 111 when the ultrasonic wave is transmitted, and the ultrasonic wave is received by using the reception transducer 121 when the ultrasonic wave is received. In this manner, it is possible to improve the transmission and reception efficiency of the ultrasonic wave.

In addition, in a case where a plurality of ultrasonic transducers for transmission-cum-reception together are disposed as the ultrasonic device, and the piezoelectric films have the same thickness dimension in the ultrasonic transducers, it is necessary to improve sensitivity of both of the transmission and reception of the ultrasonic waves. In this case, when the piezoelectric film of the ultrasonic transducer for transmission-cum-reception is thin, the transmission efficiency decreases. When the piezoelectric film thereof is thick, the reception efficiency decreases. Therefore, there is a limit to increasing both of the transmission efficiency and the reception efficiency of the ultrasonic wave. In this respect, in the embodiment, as described above, the transmission transducer 111 and the reception transducer 121 are separately provided, and the transmitting piezoelectric film 112B and the receiving piezoelectric film 122B are formed to have the thickness dimension corresponding to each of the characteristics of the transmission and reception. Therefore, it is possible to more improve both of the transmission efficiency and the reception efficiency of the ultrasonic wave, compared to a case where the ultrasonic transducer for transmission-cum-reception is used.

Second Embodiment

Next, a second embodiment will be described. In the following description, the same reference signs are assigned to the configurations already described, and thus the description thereof is omitted or simplified.

In the first embodiment, an example, in which, in plan view in the Z direction, the area (first area) of the overlap between the lower transmission electrode 112A, the transmitting piezoelectric film 112B, and the upper electrode 112C is the same as the area (second area) of the overlap between the lower reception electrode 122A, the receiving piezoelectric film 122B, and the upper electrode 112C, is exemplified. In this respect, the second embodiment differs from the first embodiment in that the first area and the second area are different from each other.

Figure 6:
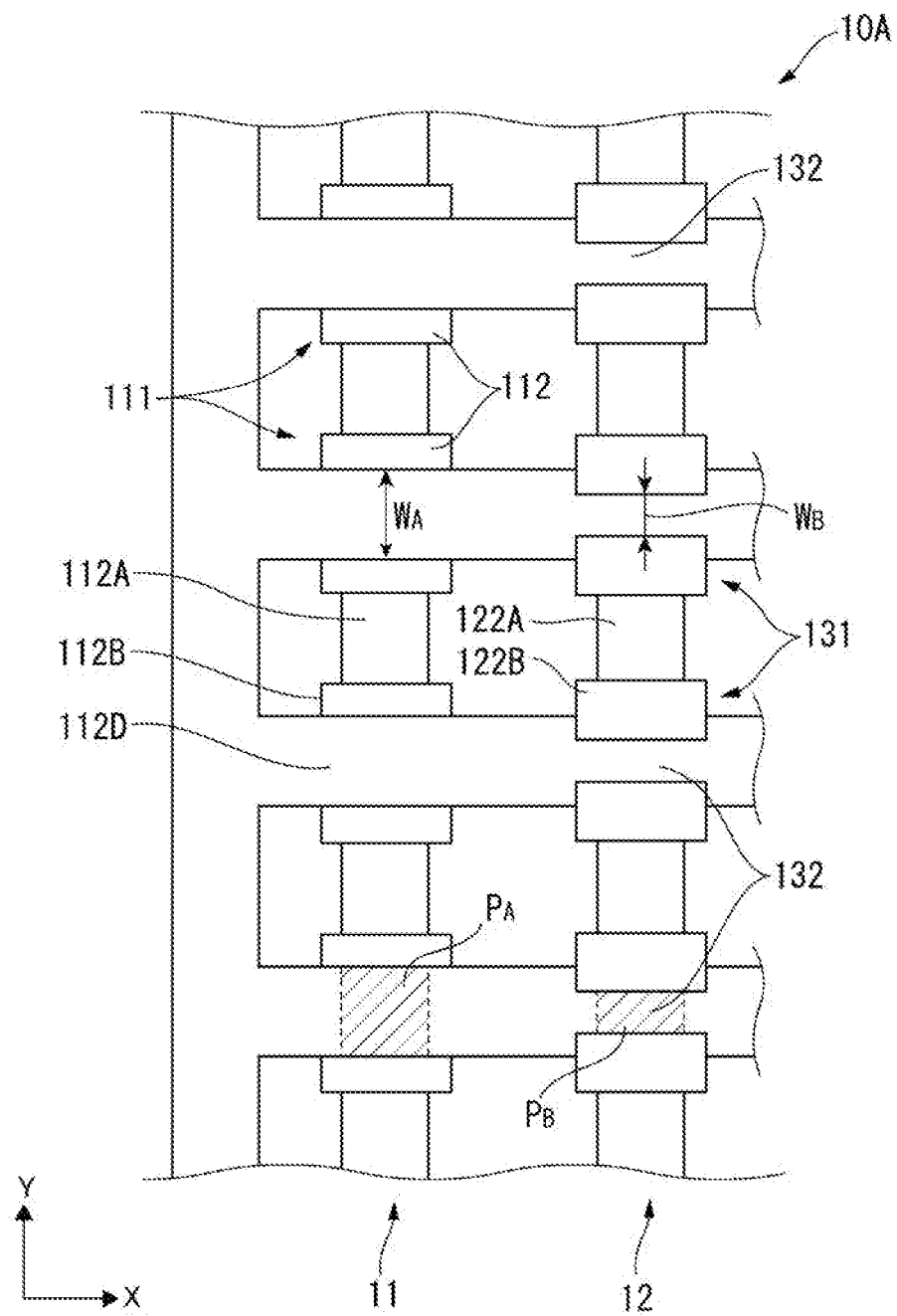
FIG. 6 is an enlarged plan view illustrating an enlarged part of an ultrasonic device of a second embodiment of the invention.

FIG. 6 is a schematic plan view illustrating a part of an ultrasonic device 10A in the second embodiment.

Similar to the first embodiment, in the embodiment, the plurality of ultrasonic transmitters 11 and the plurality of ultrasonic receivers 12 are disposed in the ultrasonic device 10A. In addition, the ultrasonic transmitter 11 is configured of the plurality of transmission transducers 111 aligned in the Y direction, and the ultrasonic receiver 12 is configured of a plurality of reception transducers 131 aligned in the Y direction.

Similar to the first embodiment, the transmission transducer 111 is configured to include the first vibration portion 102A and the transmission piezoelectric element 112, and the transmission piezoelectric element 112 is configured to include the lower transmission electrode 112A, the transmitting piezoelectric film 112B, and an upper electrode 112D which are disposed from the side of the first vibration portion 102A in this order. Similar to the first embodiment, the upper electrode 112D is provided over the reception transducers 131 from the transmission transducer 111.

Here, in the embodiment, an electrode width in a part of the upper electrode 112D, which constitutes the transmission piezoelectric element 112 (an overlap part between the lower transmission electrode 112A and the transmitting piezoelectric film 112B) is set to have a first width dimension $W_A$.

On the other hand, the reception transducer 131 is configured to include the second vibration portion 102B and a reception piezoelectric element 132, and the reception piezoelectric element 132 is configured to include the lower reception electrode 122A, the receiving piezoelectric film 122B, and the upper electrode 112D which are disposed from the side of the first vibration portion 102A in this order. Here, an electrode width in a part of the upper electrode 112D, which constitutes the reception piezoelectric element 132 (an overlap part between the lower reception electrode 122A and the receiving piezoelectric film 122B) is set to have a second width dimension $W_B$, and the second width dimension $W_B$ is smaller than the first width dimension $W_A$. Here, the width dimension of the lower reception electrode 122A is the same as the width dimension of the lower transmission electrode 112A.

Incidentally, in the transmission piezoelectric element 112, a part that is practically driven by applying the voltage is a part in which the lower transmission electrode 112A, the transmitting piezoelectric film 112B, and the upper electrode 112D overlap each other. Here, an area of the part, in which the lower transmission electrode 112A, the transmitting piezoelectric film 112B, and the upper electrode 112D overlap each other, is set as a first area $P_A$.

On the other hand, a potential difference that is detected due to a displacement of the reception piezoelectric element 132 is a potential difference of the part in which the lower reception electrode 122A, the receiving piezoelectric film 122B, and the upper electrode 112D overlap each other. Here, an area of the part, in which the lower reception electrode 122A, the receiving piezoelectric film 122B, and the upper electrode 112D overlap each other, is set as a second area $P_B$.

As described above, in the embodiment, the upper electrode 112D has the electrode width of the first width dimension $W_A$ in the transmission piezoelectric element 112 and has the electrode width of the second width dimension $W_B$ smaller than the first width dimension $W_A$ in the reception piezoelectric element 132. Therefore, the second area $P_B$ is smaller than the first area $P_A$.

In the second embodiment, it is possible to further improve the reception efficiency in the reception transducer 131.

In other words, a receiving signal, which is output from the reception transducer 131 when the ultrasonic wave is received in the reception transducer 131, is a potential difference $\Delta V$ between the lower reception electrode 122A and the upper electrode 112D, which occurs when the receiving piezoelectric film 122B is deformed. When $\Delta Q$ represents electric charge of electrodes 122A and 112D, and C represents the capacitance between the reception electrodes (the lower reception electrode 122A and the upper electrode 112D), the potential difference $\Delta V$ can be described by Expression (1).

$$\Delta V = \Delta Q / C \quad (1)$$

As described in Expression (1), in order to increase the voltage of the receiving signal, it is preferable that the capacitance C is small. In addition, when ε represents a permittivity between the reception electrodes, S represents an electrode area, and d represents a distance between the reception electrodes, the capacitance C is a value obtained from Expression (2).

$$C = \varepsilon S / d \quad (2)$$

By using Expressions (1) and (2), in the reception transducer 131, the electrode area S decreases or the distance d between the reception electrodes increases. In this manner, it is found that the capacitance C between the electrodes decreases, and the voltage of the receiving signal increases. However, when an intra-electrode distance d increases, the stiffness of the receiving piezoelectric film 122B in the Z direction increases, and thus it is difficult for the receiving piezoelectric film 122B to be bent as illustrated in FIG. 5. In this case, the potential difference occurring in the receiving piezoelectric film 122B decreases, and the voltage of the receiving signal decreases.

In this respect, in a case where the electrode area S decreases, it is possible to decrease the capacitance C while flexibility of the receiving piezoelectric film 122B is maintained. Accordingly, it is possible to suitably increase the voltage of the receiving signal, and thus further improvement of the reception efficiency is achieved.

In particular, in the ultrasonic device 10A, in a case where a process of transmitting the ultrasonic wave from the transmission transducer 111 and receiving the reflected wave by the reception transducer 131 (a transmitting and receiving process of the ultrasonic wave) is performed, the reflected wave is attenuated while the wave is propagated in the medium such as the air. Hence, in particular, it is necessary to increase the reception efficiency in the reception transducer 131. In the embodiment, by employing such a configuration described above, it is possible to improve the reception efficiency of the reception transducer 131, and it is possible to suitably execute the transmitting and receiving process of the ultrasonic wave as described above.

Third Embodiment

Next, a third embodiment will be described.

In the second embodiment, an example in which, as a configuration for decreasing the capacitance C between the reception electrodes in the reception transducer 131, the second area $P_B$ of an overlap between the lower reception electrode 122A, the receiving piezoelectric film 122B, and the upper electrode 112D is smaller than the first area $P_A$ of an overlap between the lower transmission electrode 112A, the transmitting piezoelectric film 112B, and the upper electrode 112D is exemplified.

In this respect, the third embodiment differs from the second electrode in that the reception transducers 131 are connected in series, and thereby the capacitance C decreases.

Figure 7:
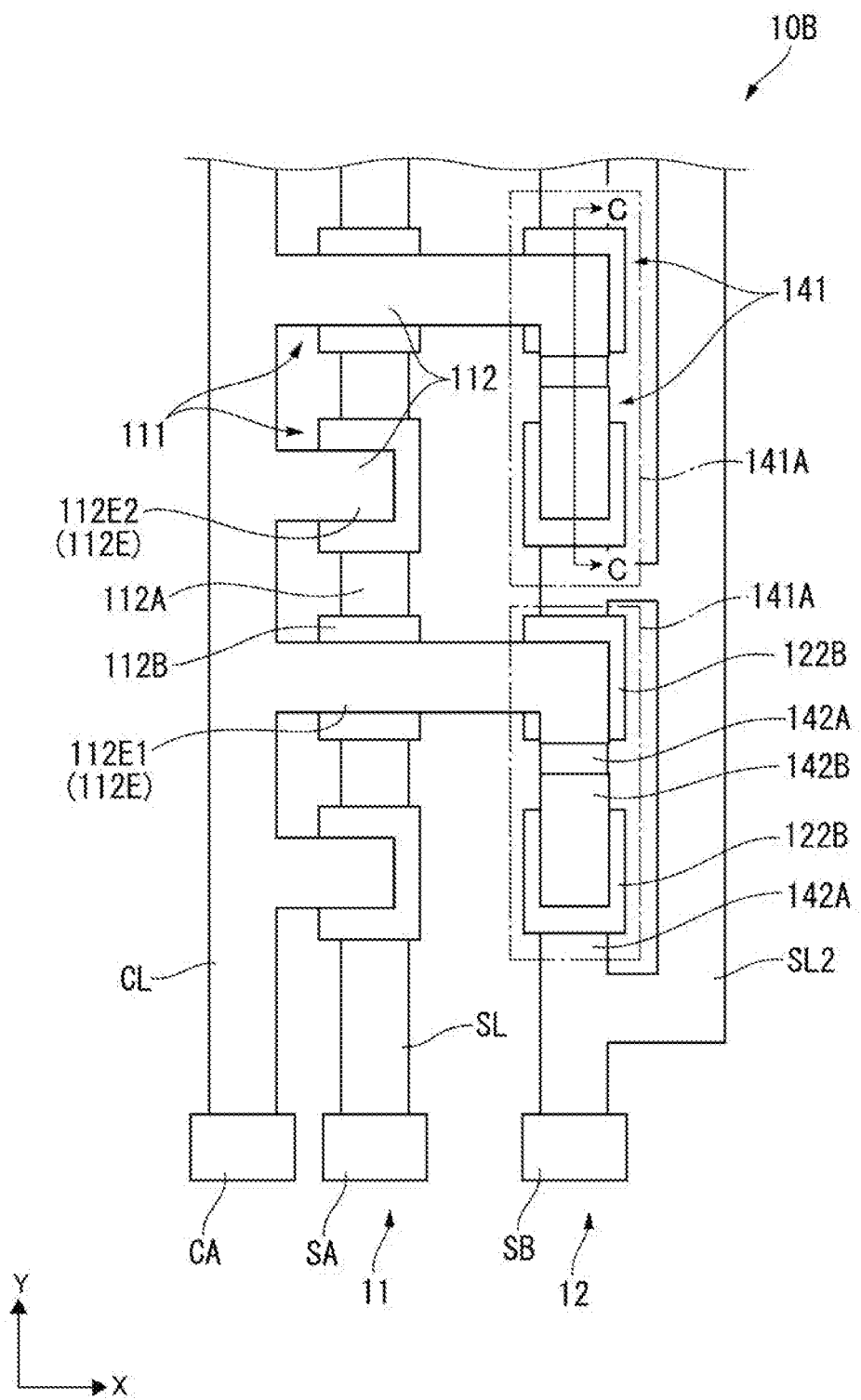
FIG. 7 is an enlarged plan view illustrating an enlarged part of an ultrasonic device of a third embodiment of the invention.
Figure 8:
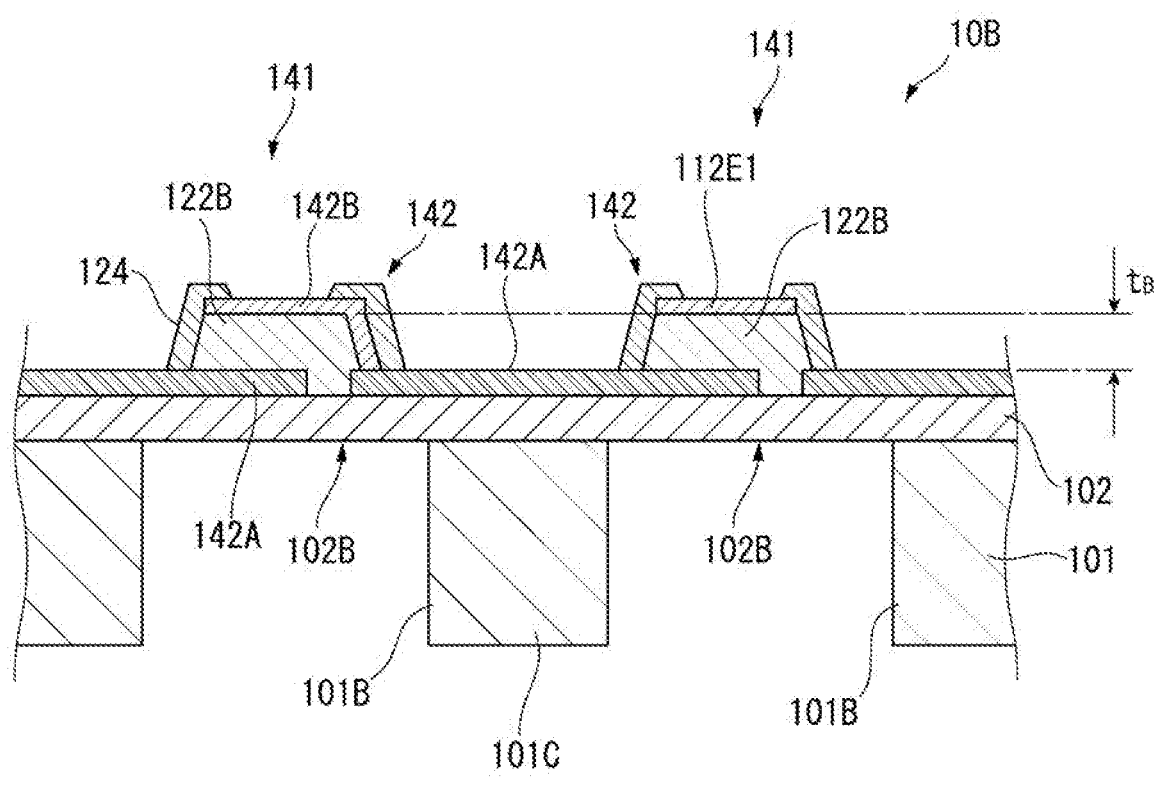
FIG. 8 is a sectional view of the ultrasonic device taken along line C-C in FIG. 7.
Figure 9:
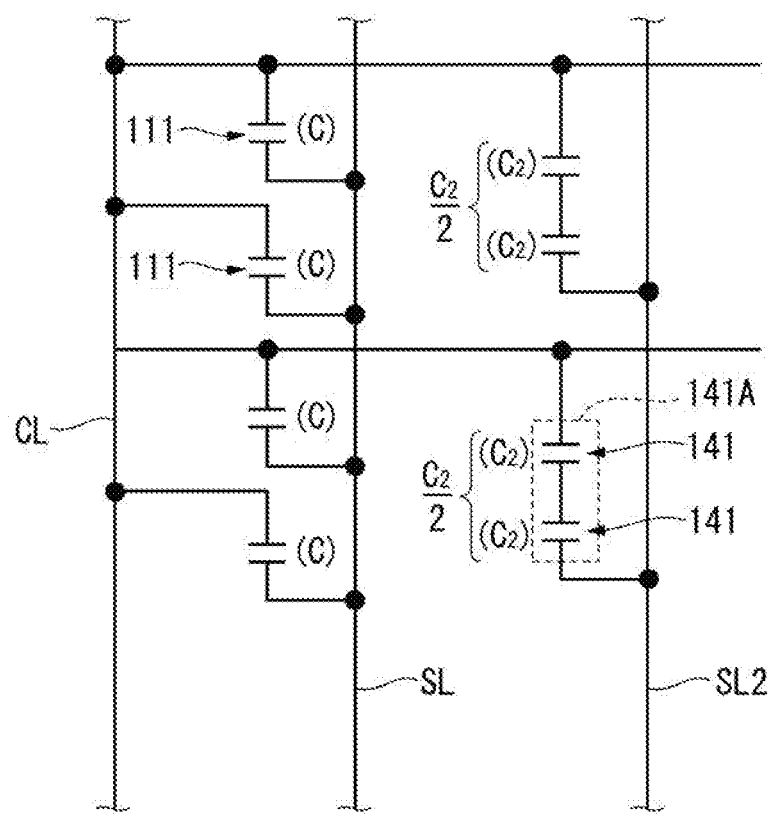
FIG. 9 is a schematic circuit diagram illustrating the ultrasonic device of the third embodiment.

FIG. 7 is an enlarged plan view illustrating an enlarged part of the ultrasonic device 10B according to a third embodiment. FIG. 8 is a sectional view of the ultrasonic device 10B taken along line C-C in FIG. 7. FIG. 9 is a circuit diagram of a part of the ultrasonic device 10B in the third embodiment.

Similar to the first embodiment or the second embodiment, in the embodiment, the plurality of ultrasonic transmitters 11 and the plurality of ultrasonic receivers 12 are disposed in the ultrasonic device 10B. In addition, the ultrasonic transmitter 11 is configured of the plurality of transmission transducers 111 aligned in the Y direction, and the ultrasonic receiver 12 is configured of a plurality of reception transducers 141 aligned in the Y direction.

The transmission piezoelectric element 112 in the transmission transducer 111 of the embodiment is configured to include the lower transmission electrode 112A, the transmitting piezoelectric film 112B, and an upper electrode 112E, which are disposed from the side of the support film 102 in this order.

Here, in the embodiment, the upper electrode 112E includes a first upper electrode 112E1 and a second upper electrode 112E2. The first upper electrode 112E1 is an electrode common to the transmission transducer 111 and the reception transducer 141 that is adjacent to the transmission transducers 111 in the X direction. On the other hand, the second upper electrode 112E2 is an electrode that connects the transmission transducer 111 and the common electrode wire CL to each other and does not overlap a reception piezoelectric element 142 in plan view.

In the ultrasonic receiver 12 of the present embodiment, one reception element group 141A is configured of a plurality of (two in examples illustrated in FIGS. 7 to 9) reception transducers 141 adjacent in the Y direction of the plurality of reception transducers 141 aligned in the Y direction, and one reception channel is configured of the plurality of reception element groups 141A aligned in the Y direction. In the embodiment, the plurality of reception transducers 141 constituting the reception element group 141A are connected in series.

Specifically, in the embodiment, a receiving-signal electrode wire SL2 is disposed at a position at which the receiving-signal electrode wire does not overlap the reception transducers 141 in the Y direction, and both end portions of the receiving-signal electrode wire SL2 are connected to the second signal terminals SB.

On the other hand, the reception piezoelectric element 142 of the reception transducer 141 disposed on one end portion (for example, an end portion on the +Y side) of the reception element group 141A is configured to include a lower reception electrode 142A, the receiving piezoelectric film 122B, and the first upper electrode 112E1. On the other hand, the reception piezoelectric element 142 of another reception transducer 141 of the reception element group 141A is configured to include the lower reception electrode 142A, the receiving piezoelectric film 122B, and an upper reception electrode 142B.

In the reception piezoelectric element 142 of the reception transducer 141 disposed on the other end portion (for example, an end portion on the −Y side) of the reception element group 141A, the lower reception electrode 142A is connected to the receiving-signal electrode wire SL2. In addition, the upper reception electrode 142B is connected to the lower reception electrode 142A of the reception transducer 141 adjacent on the +Y side.

As described above, the reception piezoelectric element 142 of the reception transducer 141 disposed on the one end portion (for example, the end portion on the +Y side) of the reception element group 141A is connected to the first upper electrode 112E1. In addition, the lower reception electrode 142A is connected to the upper reception electrode 142B of the reception transducer 141 adjacent on the −Y side.

In the reception transducers 141 disposed other positions except for both end portions of the reception element group 141A, the lower reception electrode 142A is connected to the upper reception electrode 142B of the reception transducer 141 adjacent on the other end side (for example, the −Y side) of the reception element group 141A. Further, the upper reception electrode 142B is connected to the lower reception electrode 142A of the reception transducer 141 adjacent on the one end side (for example, the +Y side) of the reception element group 141A. As described in the embodiment, in a case where two reception transducers 141 are included in the reception element group 141A, the upper reception electrode 142B of the reception transducer 141 that is connected to the receiving-signal electrode wire SL2 and the lower reception electrode 142A of the reception transducer 141 that is connected to the common electrode wire CL are connected to each other.

In the ultrasonic device 10B configured as described above, as illustrated in FIG. 9, in a case where the capacitance between the reception electrodes (the lower reception electrode 142A and the upper reception electrode 142B (or the first upper electrode 112E1)) in the reception transducers 141 is $C_2$, the apparent capacitance of the reception element group 141A, in which the n reception transducers 141 are connected in series, is $C_2/n$ (in the embodiment, n=2). Hence, the embodiment employs a configuration in which a receiving signal is output from each of the reception element groups 141A of which the capacitance is $C_2/n$, the receiving signal that is output from the reception element group 141A has a higher voltage value than the receiving signal that is output when the ultrasonic wave is received by a single reception transducer 141 (capacitance $C_2$). In other words, a receiving signal obtained by adding signals which are output from the reception transducers 141 connected in series is output from the reception element group 141A.

In this manner, similar to the second embodiment, it is also possible to increase the reception efficiency of the ultrasonic wave in the ultrasonic receiver 12 in the embodiment.

Fourth Embodiment

Next, a fourth embodiment will be described. In the fourth embodiment, a distance sensor is described as an example of an ultrasonic measuring apparatus including the ultrasonic device 10, 10A or 10B described in the first to third embodiments.

Figure 10:
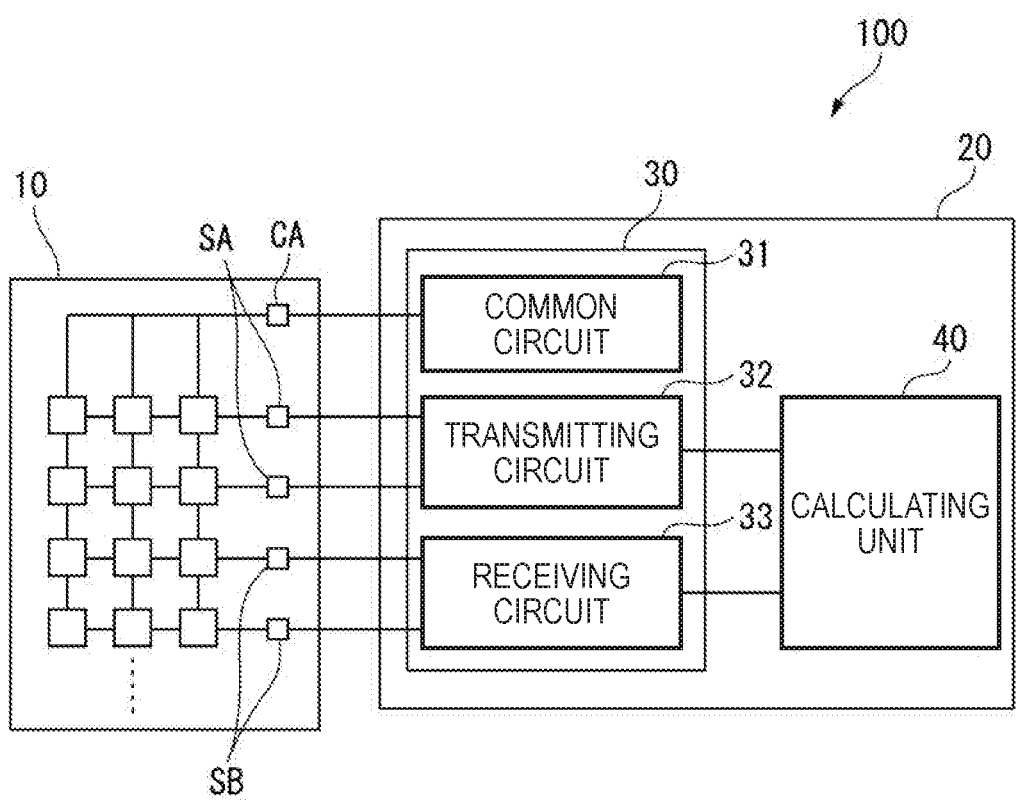
FIG. 10 is a block diagram illustrating a schematic configuration of a distance sensor according to a fourth embodiment of the invention.

FIG. 10 is a diagram illustrating a schematic configuration of a distance sensor 100 according to the embodiment. Here, the example in which the ultrasonic device 10 is assembled in the distance sensor 100; however, the ultrasonic device 10A of the second embodiment or the ultrasonic device 10B of the third embodiment may be assembled therein.

As illustrated in FIG. 10, the distance sensor 100 of the embodiment is configured to include the ultrasonic device 10 and a controller 20 that controls the ultrasonic device 10. The controller 20 is configured to include a drive circuit 30, which drives the ultrasonic device 10, and a calculating unit 40. In addition, the controller 20 may include a storage unit in which various types of data, various types of programs, or the like for controlling the distance sensor 100 are stored.

The drive circuit 30 is a driver circuit for controlling the drive of the ultrasonic device 10 and includes a common circuit 31, a transmitting circuit 32, a receiving circuit 33, and the like, as illustrated in FIG. 10.

The common circuit 31 is connected to the common terminal CA, and the common voltage (for example, 0 V or the like) is applied to the upper electrode 112C.

The transmission circuit 32 is connected to the first signal terminal SA and the calculating unit 40, outputs a drive signal having a pulse waveform to the lower transmission electrode 112A based on the control of the calculating unit 40, and the ultrasonic wave is transmitted from each of the transmission transducer 111.

The receiving circuit 33 is connected to the second signal terminal SB and the calculating unit 40, and the receiving signal obtained when the ultrasonic wave is received by the reception transducer 121. For example, the receiving circuit 33 is configured to have a linear noise amplifier, an A/D converter, or the like, converts the input receiving signal into a digital signal, removes a noise component, executes the signal process of amplification or the like to a predetermined signal level, and then outputs the processed receiving signal to the calculating unit 40.

The calculating unit 40 is configured of a central processing unit (CPU) or the like, for example, controls the ultrasonic device 10 via the drive circuit 30, and executes the transmitting and receiving processes of the ultrasonic wave by the ultrasonic device 10.

In other words, the calculating unit 40 controls the transmitting circuit 32 such that the drive signal is output to the transmission transducer 111 of the ultrasonic device 10, and the ultrasonic wave is transmitted. In addition, when the ultrasonic wave is reflected from the target object, and the reflected wave is incident to the reception transducer 121, a receiving signal output from the reception transducer 121 is acquired via the receiving circuit 33. The calculating unit 40 calculates a distance from the ultrasonic device 10 to the target object by time of flight (ToF) method using both of the time from a transmission timing when the ultrasonic wave is transmitted from the ultrasonic device 10 to a timing when the receiving signal is received and a sound speed in the air.

The distance sensor 100 of the embodiment described above includes the ultrasonic device 10 described in the first embodiment. As described above, in the ultrasonic device 10, the thickness dimension $t_A$ of the transmitting piezoelectric film 112B in the transmission transducer 111 is larger than the thickness dimension $t_B$ of the receiving piezoelectric film 122B in the reception transducer 121, and the transmission and reception efficiency of the ultrasonic wave is high. Hence, the calculating unit 40 is capable of calculating the distance from the ultrasonic device 10 to the target object with high accuracy, based on the highly accurate result of transmission and reception of the ultrasonic wave, which is obtained by the ultrasonic device 10.

Modification Example

The invention is not limited to the embodiments described above, and the invention also includes a configuration obtained through modification, improvement, and an appropriate combination of the embodiments in a range in which it is possible to achieve the object of the invention.

In the second embodiment, the electrode width (second width dimension $W_B$) of the upper electrode 112D constituting the reception piezoelectric element 132 is smaller than the electrode width (first width dimension $W_A$) of the upper electrode 112D constituting the transmission piezoelectric element 112, and thereby the second area $P_B$ is smaller than the first area $P_A$; however, the invention is not limited thereto. For example, the electrode width of the lower reception electrode 122A is smaller than the electrode width of the lower transmission electrode 112A, and thereby the second area $P_B$ may be smaller than the first area $P_A$.

Otherwise, both of the electrode width of the upper electrode 112D of the reception piezoelectric element 122 and the electrode width of the lower reception electrode 122A may be configured to be small.

In the second embodiment and the third embodiment, the configuration in which the second area $P_B$ is small and the configuration in which the reception transducers 141 are connected in series are exemplified; however, a combination of the configurations may be used. In other words, the plurality of reception transducers are connected in series, and the area of the overlap between the lower reception electrode, the receiving piezoelectric film, and the upper reception electrode is small in each of the reception transducers. In this case, the capacitance C decreases more, and thus it is possible to obtain a receiving signal having a higher voltage.

In the first and second embodiments described above, a configurational example, in which the ultrasonic device 10 transmits the ultrasonic wave from the first opening 101A of the element substrate 101, and the ultrasonic wave that is incident from the second opening 101B is received, is exemplified; however, the invention is not limited thereto. For example, a configuration, in which the ultrasonic wave is transmitted to the opposite side (side of the transmission piezoelectric element 112) to the first opening 101A, and the ultrasonic wave that is incident from the opposite side (side of the reception piezoelectric element 122) to the second opening 101B is received, may be employed.

In the fourth embodiment described above, the distance sensor 100 is exemplified as an example of the ultrasonic measuring apparatus; however, the fourth embodiment is not limited thereto. For example, the invention can be applied to an ultrasonic measuring apparatus or the like that measures an internal tomogram of a structure, depending on a transmission and reception result of the ultrasonic wave.

In addition, the specific structures used when the invention is implemented may be configured by appropriately combining the embodiments and the modification examples or may be appropriately modified to obtain another structure in a range in which it is possible to achieve the object of the invention.

The entire disclosure of Japanese Patent Application No. 2017-207578 filed Oct. 26, 2017 is expressly incorporated herein by reference.

What is claimed is:

1. An ultrasonic device comprising:
three axes orthogonal to each other being defined as an X axis, a Y axis, and a Z axis;
a substrate extending on an X-Y plane along the X axis and the Y axis, the substrate having a first opening, a second opening, and a partition, the first opening and the second opening being located next to each other via the partition along the X axis, the substrate having a thickness along the Z axis;
a support film that is provided on the partition of the substrate and covers the first opening and the second opening;
an ultrasonic transmitter configured to transmit an ultrasonic wave, the ultrasonic transmitter being configured with a plurality of transmission transducers arranged along the Y axis, each of the plurality of transmission transducers being configured with:
a first lower electrode disposed on the support film, the first lower electrode being overlapped with the first opening along the Z axis;
a transmitting piezoelectric film disposed on the support film and the first lower electrode, the transmitting piezoelectric film being overlapped with the first opening along the Z axis; and
a common electrode disposed on the transmitting piezoelectric film, the transmitting piezoelectric film being sandwiched between the first lower electrode and the common electrode along the Z axis; and
an ultrasonic receiver configured to receive the ultrasonic wave, the ultrasonic receiver being configured with a plurality of reception transducers arranged along the Y axis, the plurality of transmission transducers being arranged directly next to the plurality of reception transducers along the X axis, each of the plurality of reception transducers being configured with:
a second lower electrode disposed on the support film, the second lower electrode being overlapped with the second opening along the Z axis;
a receiving piezoelectric film disposed on the support film and the second lower electrode, the receiving piezoelectric film being overlapped with the second opening along the Z axis; and
the common electrode disposed on the receiving piezoelectric film, the receiving piezoelectric film being sandwiched between the second lower electrode and the common electrode along the Z axis,
wherein a thickness dimension along the Z axis of the transmitting piezoelectric film is larger than a thickness dimension along the Z axis of the receiving piezoelectric film,
the common electrode of the plurality of transmission transducers and the common electrode of the plurality of reception transducers are the same common electrode,
each of the plurality of transmission transducers has a first overlapped area in which the first lower electrode, the transmitting piezoelectric film, and the common electrode are directly overlapped one another along the Z axis,
each of the plurality of reception transducers has a second overlapped area in which the second lower electrode, the receiving piezoelectric film, and the common electrode are directly overlapped one another along the Z axis, and
the second overlapped area is smaller than the first overlapped area when viewed along the Z axis.

2. The ultrasonic device according to claim 1, wherein the plurality of reception transducers are connected in series.

3. An ultrasonic measuring apparatus comprising:
three axes orthogonal to each other being defined as an X axis, a Y axis, and a Z axis;
an ultrasonic device, the ultrasonic device including:
a substrate extending on an X-Y plane along the X axis and the Y axis, the substrate having a first opening, a second opening, and a partition, the first opening and the second opening being located next to each other via the partition along the X axis, the substrate having a thickness along the Z axis;
a support film that is provided on the partition of the substrate and covers the first opening and the second opening;
an ultrasonic transmitter configured to transmit an ultrasonic wave, the ultrasonic transmitter being configured with a plurality of transmission transducers arranged along the Y axis, each of the plurality of transmission transducers being configured with:
a first lower electrode disposed on the support film, the first lower electrode being overlapped with the first opening along the Z axis;
a transmitting piezoelectric film disposed on the support film and the first lower electrode, the transmitting piezoelectric film being overlapped with the first opening along the Z axis; and
a common electrode disposed on the transmitting piezoelectric film, the transmitting piezoelectric film being sandwiched between the first lower electrode and the common electrode along the Z axis; and
an ultrasonic receiver configured to receive the ultrasonic wave, the ultrasonic receiver being configured with a plurality of reception transducers arranged along the Y axis, the plurality of transmission transducers being arranged directly next to the plurality of reception transducers along the X axis, each of the plurality of reception transducers being configured with:
a second lower electrode disposed on the support film, the second lower electrode being overlapped with the second opening along the Z axis;
a receiving piezoelectric film disposed on the support film and the second lower electrode, the receiving piezoelectric film being overlapped with the second opening along the Z axis; and
the common electrode disposed on the receiving piezoelectric film, the receiving piezoelectric film being sandwiched between the second lower electrode and the common electrode along the Z axis; and
a controller configured to control the ultrasonic device, wherein a thickness dimension along the Z axis of the transmitting piezoelectric film is larger than a thickness dimension along the Z axis of the receiving piezoelectric film, the common electrode of the plurality of transmission transducers and the common electrode of the plurality of reception transducers are the same common electrode, each of the plurality of transmission transducers has a first overlapped area in which the first lower electrode, the transmitting piezoelectric film, and the common electrode are directly overlapped one another along the Z axis, each of the plurality of reception transducers has a second overlapped area in which the second lower electrode, the receiving piezoelectric film, and the common electrode are directly overlapped one another along the Z axis, and the second overlapped area is smaller than the first overlapped area when viewed along the Z axis.

4. The ultrasonic measuring apparatus according to claim 3, wherein the plurality of reception transducers are connected in series.

\* \* \* \* \*